United States Patent [19]
Sajna

[11] Patent Number: 5,923,522
[45] Date of Patent: Jul. 13, 1999

[54] CAPACITIVE SWITCH WITH ELASTOMERIC MEMBRANE ACTUATOR

[75] Inventor: Jeffrey L. Sajna, St. Charles, Ill.

[73] Assignee: Eaton Corporation, Cleveland, Ohio

[21] Appl. No.: 08/883,812

[22] Filed: Jun. 27, 1997

[51] Int. Cl.[6] .................................................. H01G 5/01
[52] U.S. Cl. ........................................ 361/288; 361/291
[58] Field of Search ..................................... 361/277, 278, 361/280, 281, 283.1, 283.2, 283.3, 287, 288, 290, 291, 293, 283.4

[56] References Cited

U.S. PATENT DOCUMENTS

| | | | |
|---|---|---|---|
| 4,423,464 | 12/1983 | Tamura et al. | 361/288 |
| 4,472,758 | 9/1984 | Goto et al. | 361/288 |
| 5,559,665 | 9/1996 | Taranowski et al. | 361/280 |

*Primary Examiner*—Kristine Kincaid
*Assistant Examiner*—Anthony Dinkins
*Attorney, Agent, or Firm*—Fay, Sharpe, Beall, Fagan, Minnich & McKee

[57] ABSTRACT

A capacitive switch assembly includes an elastomeric sheet actuator for elastically supporting a switching member above a capacitive element comprised of a pair of conductive plates and a dielectric sheet. The elastomeric sheet supports the switching member so that upon user actuation to compress the elastomeric sheet, the switching member is directed to engage the capacitive element and selectively compress to effectively form a variable capacitor. Resilient deformation of the switching member can further vary the capacitance of the capacitor in an electrically detectable manner.

2 Claims, 1 Drawing Sheet

CAPACITIVE SWITCH WITH ELASTOMERIC MEMBRANE ACTUATOR

BACKGROUND OF THE INVENTION

The present invention relates to switch technology, and more particularly capacitive switch technology for switching fractional ampere current with an actuator that can provide a tactile feedback snap action in response to a push-to-actuate type of operation. Switches of this type are particularly desirable where low cost, compact size and minimal protrusion from a panel are desired. Cellular phone keypads are a typical application of such desired switch type action.

Capacitance change type switching technology has been most commonly used for smooth panel switches where the user touches a laminate on the panel to effect a change in capacitance between two plates. The change is detected by appropriate circuity and discerned as a switching operation. Combining such capacitive switching technology with an actuator that provides a tactically discernible indication of movement similar to the switching of a mechanical contact type switch is disclosed in U.S. Pat. No. 5,559,665, wherein a spring biased movable actuator is employed to effect compression of a resilient conductive disk in contact with a dielectric material for effecting a discernable capacitance change. However, the push-button type actuator assembly disclosed in this patent includes an undesirable number of parts with attendant increased costs therefor. Accordingly, there is a need for a simpler, lower cost switch assembly capable of functioning as a low current switching element that can provide tactile feedback from actuator movement during the switching operation to allow a user to recognize the switching. Such an assembly has particular applicability to automotive environments wherein switch operation can frequently occur without need for visual perception such as heating and cooling blower fan controls. Other possible uses are window or door lock switches on a car door arm rest.

The present invention contemplates a new and improved capacitive switch technology which overcomes all the above-referred to problems and others to provide a new capacitive switch assembly which is simple in design for improved parts consolidation and cost reduction, economical to manufacture, readily adaptable to a plurality of uses in a variety of dimensional configurations, easy to install, easy to operate and which provides improved switching operation in an environment such as an automobile.

BRIEF SUMMARY OF THE INVENTION

In accordance with the present invention, there is provided a capacitive switch assembly particularly suited for switching fractional ampere current for control circuits such as are needed for window and door lock operations in an automobile. The new switch assembly is generally comprised of a substrate, a pair of conductive plates disposed on the substrate, a dielectric sheet disposed on a common side of the plates and a switching member comprising an elastomeric pill or disk interspersed with conductive material and disposed oppositely from the sheet for selective contact therewith upon movement of the switching member from a first rest position towards the sheet. The switching actuator comprises an elastomeric sheet having a sidewall base engaging the substrate and a top wall holding the switching member. The actuator and substrate encase the plates, the dielectric sheet and the switching member. The actuator effects the movement of the switching member upon use or actuation to compress the switching member in contact with the dielectric and to form with said plates a variable capacitor, wherein resilient deformation of the switching member varies the capacitance of the capacitor in an electrically detectable manner.

In accordance with another aspect of the present invention, the actuator includes a deflectable skirt portion disposed to engage the substrate upon the movement of the switching member towards the sheet, wherein the skirt portion will buckle upon a predetermined deflection for providing a tactile feedback to a user. The buckling action is somewhat perceived by a user to be a discernable snapping action occurring when the skirt is deflected beyond a predetermined position.

In accordance with a more limited aspect of the present invention, the elastomeric sheet comprises a plurality of actuators and switching members selectively disposed for alignment with an associated plurality of conductive plates and dielectric sheets. Each of the plurality of actuators, switching member, conductive plates and dielectric sheets functions as an independent switch so that a single elastomeric sheet is usable with a plurality of underlying capacitive elements.

One benefit obtained by use of the present invention is a switch assembly wherein an actuator is comprised of a single unitary elastomeric sheet that can not only function as a protective shield of underlying circuitry, but can be configured to cover a plurality of different switching elements. Accordingly, it can be appreciated that use of a single elastomeric sheet to provide a resilient actuator, as opposed to a plurality of independently supported actuator assemblies, provides substantial improvement in availability and adaptability of a plurality of switching elements.

Other benefits and advantages for the subject new switching assembly will become apparent to those skilled in the art upon a reading and understanding of this specification.

BRIEF DESCRIPTION OF THE DRAWINGS

The invention may take physical form in certain parts and arrangement of parts, the preferred embodiments of which will be described in detail in this specification and illustrated in the accompanying drawings which form a part hereof and wherein.

DETAILED DESCRIPTION OF THE INVENTION

Figure 1:
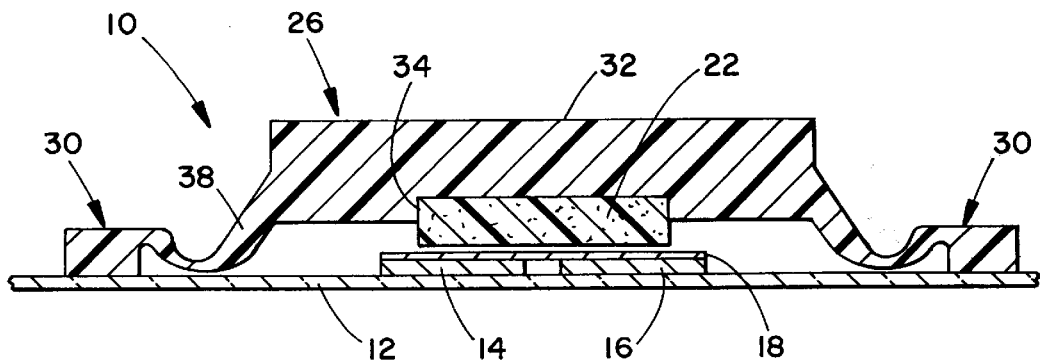
FIG. 1 is a cross-sectional view of a single switching assembly formed in accordance with the present invention.

With particular reference to FIG. 1, a capacitive switch including an elastomeric membrane actuator is illustrated in cross-section thereon. The switch assembly 10 is comprised of a ceramic substrate 12, through which or to which appropriate electrical leads (not shown) are conventionally connected to electrodes 14, 16 formed of conductive material, preferably a thin-film disposed in spaced coplanar arrangement. A conductive ink formed of a mixture of palladium and silver can be screened on the substrate 12 to satisfy this structural requirement. Dielectric 18, preferably a mixture of ferro-electric and glass material, is screened upon the electrodes 14, 16, also in a conventional and known manner. As clearly seen in the reference, the dielectric sheet is thus disposed on a common side of each of the plate electrodes 14, 16.

A switching member 22, formed of a conductive elastomer, is disposed opposite of the dielectric 18 for selective contact therewith upon movement of the switching member from a first rest position towards the sheet 18. Switching member 22, conventionally referred to as a conductive disk or pill, is formed of elastomer interspersed with conductive material so that as the elastomer is compressed, the capacitance of the assembly will detectably vary.

It is a feature of the invention that the switching member 22 is primarily supported by an elastomeric sheet 26 including a sidewall base portion 30 that directly engages the substrate 12 to support the sheet 26 and a top wall portion 32, including a recess 34 in which the switching member 22 is received. It can be appreciated that the top wall 32 and sidewall 30 are connected by a deflectable skirt portion 38 which resiliently supports the top wall 32 and switching member 22 above the dielectric 18. The skirt portion 38 will engage the substrate upon movement of the switching member towards the dielectric sheet, wherein the skirt portion will buckle upon a predetermined deflection for providing a tactile feedback to the user of a snap-action type movement. As noted above, not only does the movement of the actuator provide such tactile feedback to a user, engagement of the switching member 22 with the dielectric 18, and continued compression thereof when in contact with the dielectric effectively forms a variable capacitor with the plates 14, 16, so that resilient deformation of the switching member 22 varies the capacitance of the capacitor in an electrically detectible manner. Upon release of the actuating member top wall 32 by a user, the elastomeric sheet will return to its original rest position as shown in the FIGURE.

Figure 2:
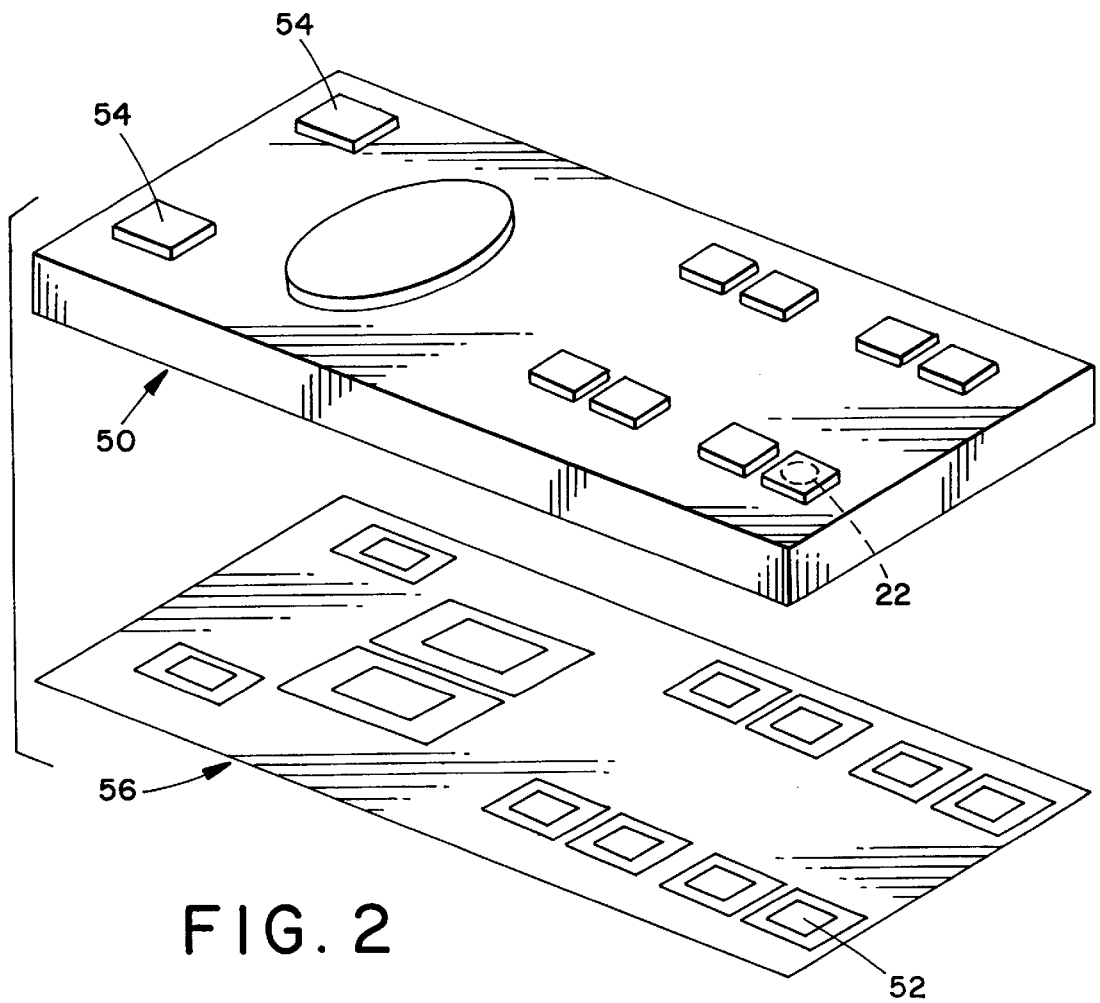
FIG. 2 is an exploded perspective view of a switching assembly where a single elastomeric sheet comprises a plurality of elastomeric actuator pads for association with a substrate including a plurality of electrode and dielectric assemblies.

With reference to FIG. 2, it can be seen that a single elastomeric sheet 50 may comprise a plurality of actuators and switching members selectively disposed for alignment with an associated plurality of capacitive elements 52. FIG. 2 shows a typical embodiment of the invention formed as a switch assembly to be disposed on a vehicle door armrest. The protrusions 54 from the sheet 50 each support a switching member 22, which is associatively aligned with a set of conductive plates and a dielectric sheet in the manner shown in FIG. 1. The substrate 56 includes a plurality of electrical connections (not shown) so that each of said switches 54 in combination with its associated capacitive element 52 can operate as an independent switch. Fastening of the sheet 50 to the substrate can occur in a variety of conventionally known manners, including an interlocking protrusion and aperture assembly, glue or mechanical fasteners.

Although the invention has been described with respect to preferred embodiments, it will be understood that the invention is capable of modification and variation and is limited only by the following claims.

I claim:

1. A capacitive switch assembly comprising:

a substrate;

a pair of conductive plates disposed on the substrate;

a dielectric sheet disposed on a common side of the plates;

a switching member formed of elastomer interspersed with conductive material and disposed oppositely from said dielectric sheet for selective contact therewith upon movement of the switching member from a first rest position towards the sheet; and an actuator comprising an elastomeric sheet having a side wall base engaging the substrate and a top wall holding the switching member, wherein the actuator and substrate encase the plates, the dielectric sheet and the switching member, wherein the actuator effects the movement of the switching member upon user actuation to compress said switching member in contact with said dielectric sheet and to form with said plates a variable capacitor, and wherein resilient deformation of said switching member varies a capacitance of the capacitor in an electrically detectable manner wherein the actuator includes a deflectable skirt portion disposed to engage the substrate upon said movement of the switching member towards the dielectric sheet for buckling the skirt portion upon a predetermined deflection whereby a tactile feedback is provided to a user.

2. The switch assembly as defined in claim 1 wherein said elastomeric sheet comprises a plurality of actuators and switching members selectively disposed for alignment with an associated plurality of conductive plates and dielectric sheets, each of said plurality of actuators and switching members and associated plurality of conductive plates and dielectric sheets operate as an independent switch.

\* \* \* \* \*